United States Patent
Filippi et al.

(10) Patent No.: US 9,105,637 B2
(45) Date of Patent: Aug. 11, 2015

(54) ANTI-FUSE STRUCTURE AND FABRICATION

(75) Inventors: Ronald G. Filippi, Wappingers Falls, NY (US); Naftali Lustig, Croton-on-Hudson, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 13/475,542

(22) Filed: May 18, 2012

(65) Prior Publication Data

US 2013/0307115 A1 Nov. 21, 2013

(51) Int. Cl.
- *H01L 23/52* (2006.01)
- *H01L 21/768* (2006.01)
- *H01L 23/525* (2006.01)
- *H01L 27/10* (2006.01)

(52) U.S. Cl.
CPC ...... *H01L 23/5252* (2013.01); *H01L 21/76816* (2013.01); *H01L 21/76807* (2013.01); *H01L 27/101* (2013.01)

(58) Field of Classification Search
CPC ... H01L 21/768; H01L 23/5252; H01L 23/52; H01L 27/101; H01L 21/76816; H01L 21/76807
USPC .......... 257/529, 530, E23.147, E21.591, 257/E21.592
See application file for complete search history.

(56) References Cited

U.S. PATENT DOCUMENTS

| | | | |
|---|---|---|---|
| 5,404,029 A | 4/1995 | Husher et al. | |
| 5,614,756 A | 3/1997 | Forouhi et al. | |
| 5,625,219 A | 4/1997 | Takagi | |
| 5,670,818 A | 9/1997 | Forouhi et al. | |
| 5,789,796 A | 8/1998 | Kang et al. | |
| 5,903,042 A | 5/1999 | Kwok et al. | |
| 6,008,716 A | 12/1999 | Kokubun | |
| 6,087,677 A | 7/2000 | Wu | |
| 6,124,194 A | 9/2000 | Shao et al. | |
| 6,143,647 A * | 11/2000 | Pan et al. | 438/637 |
| 6,150,199 A | 11/2000 | Whitten et al. | |
| 6,251,710 B1 | 6/2001 | Radens et al. | |
| 6,380,003 B1 | 4/2002 | Jahnes et al. | |
| 6,506,981 B1 | 1/2003 | Liberkowski | |
| 6,767,768 B2 | 7/2004 | Hsieh | |
| 6,825,489 B2 | 11/2004 | Kozicki | |
| 7,402,463 B2 | 7/2008 | Yang et al. | |
| 7,450,431 B1 | 11/2008 | Karp et al. | |

(Continued)

*Primary Examiner* — Asok K Sarkar
*Assistant Examiner* — Dmitriy Yemelyanov
(74) *Attorney, Agent, or Firm* — L. Jeffrey Kelly; Catherine Ivers (57) ABSTRACT

A method including a first interconnect level including a first electrode embedded in a first dielectric layer, a top surface of the first electrode is substantially flush with a top surface of the first dielectric layer, a second interconnect level including a via embedded in a second dielectric layer above the first dielectric layer, a third dielectric layer in direct contact with and separating the first dielectric layer and the second dielectric layer, an entire top surface of the first electrode is in direct physical contact with a bottom surface of the third dielectric layer, and an interface between the first dielectric layer and the third dielectric layer extending from the top surface of the first electrode to the via, the interface including a length less than a minimum width of the via, a bottom surface of the via is in direct physical contact with the first dielectric layer.

10 Claims, 11 Drawing Sheets

(56) References Cited

U.S. PATENT DOCUMENTS

| | | |
|---|---|---|
| 7,569,429 B2 | 8/2009 | Park |
| 7,572,682 B2 | 8/2009 | Yang et al. |
| 7,713,857 B2 | 5/2010 | Gibbons et al. |
| 7,728,390 B2 | 6/2010 | Kuo et al. |
| 7,888,255 B2 | 2/2011 | Gibbons et al. |
| 7,911,025 B2 | 3/2011 | Hsu et al. |
| 8,008,700 B2 | 8/2011 | Kumar et al. |
| 8,736,020 B2 | 5/2014 | Bao et al. |
| 2001/0036750 A1* | 11/2001 | Radens et al. ............ 438/770 |
| 2011/0031997 A1 | 2/2011 | Or-Bach et al. |
| 2011/0241078 A1 | 10/2011 | Lung |

* cited by examiner

ANTI-FUSE STRUCTURE AND FABRICATION

BACKGROUND OF THE INVENTION

1. Field of the Invention

The present invention generally relates anti-fuses for use in semiconductor devices. In particular, the invention relates to non-intrinsic anti-fuse structures and methods of making the same.

2. Description of Related Art

Anti-fuses are structures that are electrically open or of very high resistance in their normal state. After programming the structure, the anti-fuse structure becomes electrically conductive. Thus, prior to programming, the anti-fuse is in an "off" state and after programming it is in an "on" state.

Figure 1A:
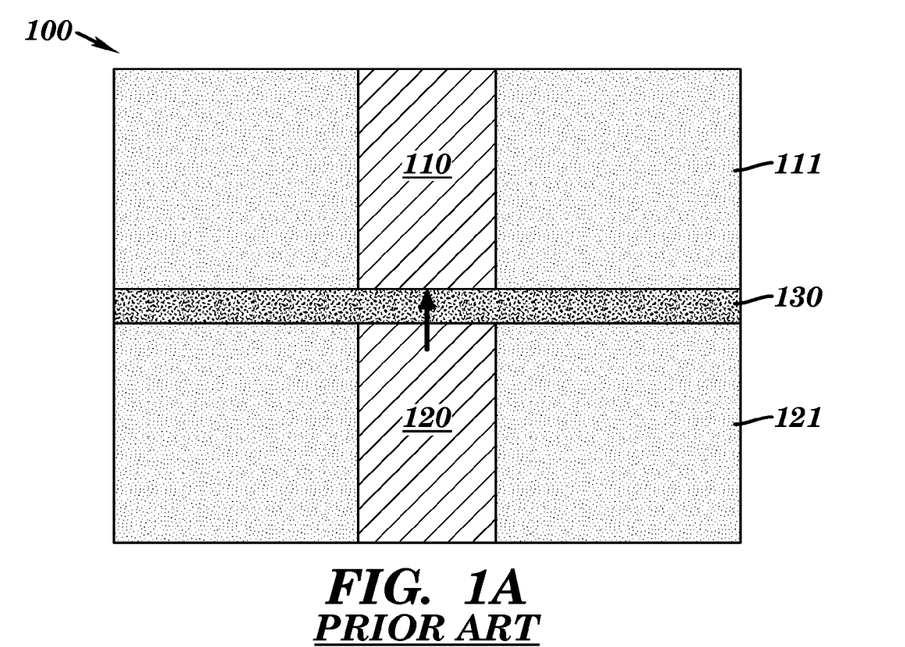
FIG. 1A illustrates a known intrinsic anti-fuse structure.

Referring to FIG. 1A, a typical vertical anti-fuse structure 100 used in the semiconductor industry has two electrodes 110, 120 embedded in two dielectric layers 111, 121. The electrodes 110, 120 are separated by an anti-fuse layer 130 comprising a dielectric material. Typically, programming the anti-fuse involves applying a voltage across the metal electrodes wherein the applied voltage is in excess of the breakdown voltage of the dielectric material between the metal electrodes. As a result, an electrically conductive filament or "link" 119 forms in the anti-fuse layer and connects the two metal electrodes (See FIG. 1B for a programmed anti-fuse structure 101).

Figure 1B:
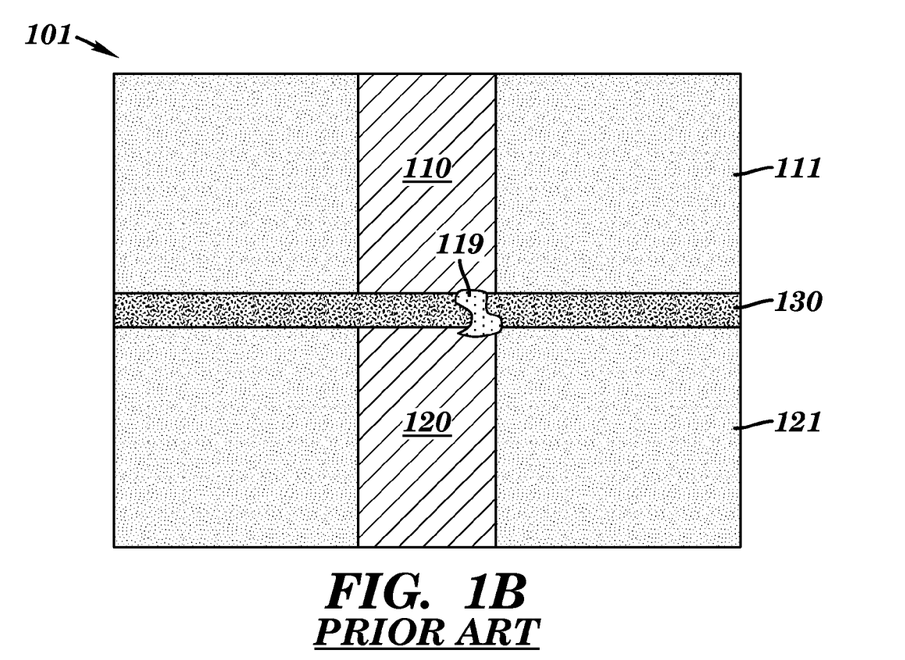
FIG. 1B illustrates a known intrinsic anti-fuse structure of FIG. 1A after programming.

FIGS. 1A and 1B illustrate an intrinsic anti-fuse structure, meaning that in order to program the anti-fuse to create a connection between the metal electrodes, the bulk thickness of the dielectric material 130 between the metal electrodes must be blown (see arrow in FIG. 1A going from electrode 120 across the bulk thickness of anti-fuse layer 130 to electrode 110). The amount of programming voltage required depends upon the breakdown voltage of the anti-fuse layer. And, among anti-fuses within the same chip, the programming voltage will vary from anti-fuse to anti-fuse depending upon the uniformity of the thickness of the anti-fuse layer 130. It is desirable to have anti-fuses with minimum programming voltage which consistently blow at substantially the same voltage throughout the chip.

In addition to high programming voltages, known anti-fuse structures require an extra mask and fabrication steps for integrating the intrinsic anti-fuse structure in the semiconductor device. It is desirable to have an anti-fuse structure which can be made without additional mask and/or processing steps.

SUMMARY

The general principal of the present invention is to provide a non-intrinsic anti-fuse structure which has a lower programming voltage and needs no additional processing steps to fabricate the structure. Here, non-intrinsic refers to the fact that instead of relying on the breakdown of a bulk insulator (intrinsic breakdown mechanism), the present invention exploits a mechanism which the semiconductor industry usually seeks to avoid: namely the reliability failure mechanism of time dependent dielectric breakdown (herein "TDDB"). In TDDB, breakdown can occur along an interface (rather than through the bulk dielectric) as a result of longer time application of relatively low electric field (as opposite to immediate, bulk breakdown, which is caused by strong electric field). In the present invention, an interconnect structure is provided in which a conductive metal from a first conductive structure diffuses along an interface of two dielectric layers to a second conductive structure, thereby forming a short and programming the anti-fuse. Because the breakdown occurs at a heterogeneous dielectric to dielectric interface rather than through a homogeneous bulk dielectric layer, the programming voltage is lower.

One embodiment of the present invention is an anti-fuse structure including a first electrode, a second electrode, a first dielectric, a second dielectric and an interface between the first and second dielectrics in which the interface couples the first and second electrodes.

Another embodiment of the present invention provides a method of making an anti-fuse structure. The method includes forming a first dielectric with first openings, and filling the first openings with a conductive material to form metals lines of a first level co-planar with the first dielectric wherein at least one of the metal lines is an electrode and at least one of the metal lines is a part of an active structure. The method also includes forming a second dielectric over the first level thereby forming an interface between the first and second dielectrics and forming a third dielectric over the second dielectric. Second openings are formed in the second and third dielectrics. The second openings are filled with conductive material to form second metal lines and vias of a second level which are coplanar with the third dielectric. At least one of the second metal lines and vias of the second level is a first electrode and at least one of the second metal lines and vias of the second level is part of the active structure.

BRIEF DESCRIPTION OF THE DRAWINGS

Other objects, aspects and advantages of the invention will become obvious in combination with the description of accompanying drawings, wherein the same number represents the same or similar parts in all figures.

DETAILED DESCRIPTION OF EMBODIMENTS

Various embodiments of an anti-fuse structure of the present invention are described in conjunction with FIGS. 2A-5B. Embodiments of methods of making the anti-fuse structures of the present invention are described in conjunction with FIGS. 7, and 8A-8D.

Figure 2A:
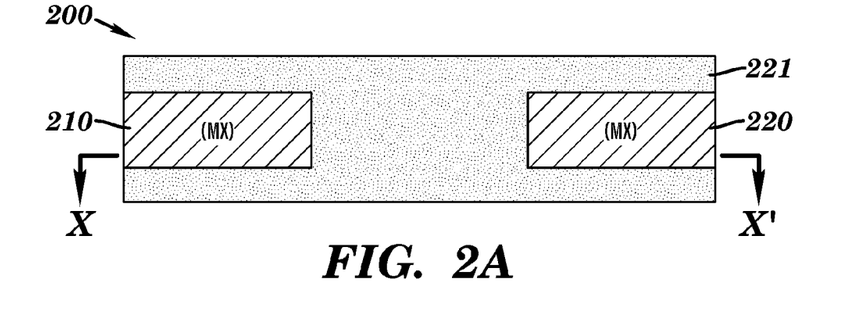
FIG. 2A is a top-down view of a non-intrinsic, single-level anti-fuse structure according to an embodiment of the present invention.

Referring to FIG. 2A, a top-down view of an anti-fuse structure 200 of an embodiment of the present invention is shown. A first electrode 210 and a second electrode 220 are in a first dielectric. A cross-section of the structure through X-X' is illustrated in FIG. 2B.

Figure 2B:
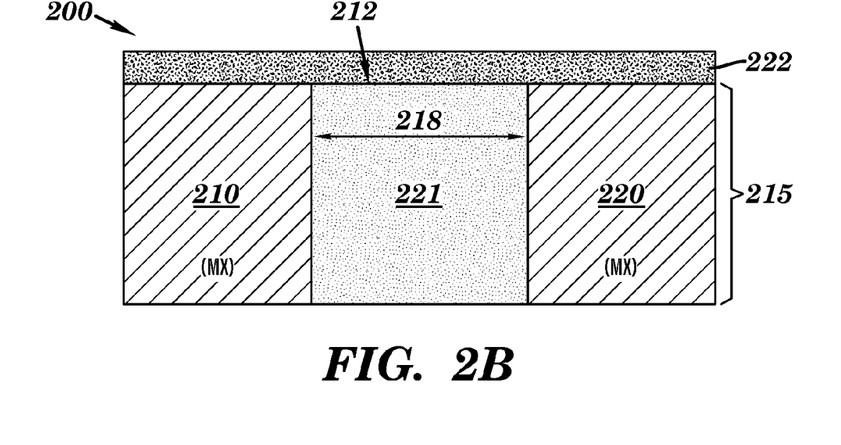
FIG. 2B illustrates a cross-section of the non-intrinsic, single-level anti-fuse structure of FIG. 2A.

Referring to FIG. 2B an embodiment of the anti-fuse structure 200 prior to programming is illustrated. Anti-fuse structure 200 includes first 210 and second 220 electrodes in a first dielectric 221. In this embodiment, the electrodes 210, 220 and first dielectric 221 are all on the same level, namely, first level 215. Therefore, the anti-fuse structure 200 of FIG. 2A/B is a single-level structure. Accordingly, the first 210 and second 220 electrodes may both be metal levels at the same level as generically indicated by MX in FIGS. 2A/B.

Continuing with FIG. 2B, a second dielectric 222 (not previously shown in FIG. 2A) is above the first level 215. The first 221 and second 222 dielectrics meet to form an interface 212. The interface couples the first 210 and second 220 electrodes. The distance along the interface 212 which couples the adjacent first 210 and second 220 electrodes is referred to as the predetermined length 218.

The electrodes 210/220 are conductive and may include one or more layers. For example, and not by limitation, the electrodes may be a bulk conductor (comprising copper or aluminum) with a lining layer (TaN/Ta or TiN/Ti). Other combinations of conductive materials are also possible including seed layers and conductive capping layers.

The first dielectric 221 typically comprises a silicon containing dielectric material. The first dielectric 221 can be a single layer or a multilayer structure of various dielectric materials. In some embodiments, the first dielectric 221 has a dielectric constant less than four. In some embodiments, the first dielectric is doped with at least one of fluorine, carbon, or pores.

The second dielectric 222 also typically comprises a silicon containing dielectric material. The second dielectric 222 can be a single layer or a multilayer structure of various dielectric materials. In some embodiments the second dielectric 222 also contains nitrogen.

While the first 221 and second 222 dielectric layers may be the same dielectric material, in a preferred embodiment, they are different dielectric materials with the second dielectric 222 material having a higher dielectric constant than the first dielectric 221 material; and/or the second dielectric 222 has better metal diffusion barrier properties than the first dielectric 221; and/or the second dielectric 222 comprises nitrogen while the first dielectric layer 221 material does not.

Figure 2C:
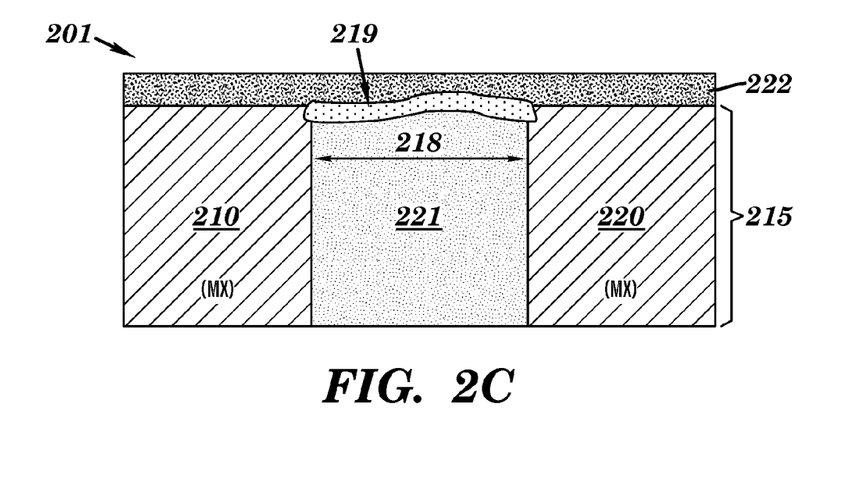
FIG. 2C illustrates a cross-section of the anti-fuse structure embodiment of FIG. 2B after programming.

Referring to FIG. 2C, the anti-fuse structure of FIG. 2B has been programmed to form an embodiment of a post-programming anti-fuse structure 201. By applying a voltage to one of the electrodes and keeping the other electrode grounded, conductive material penetrates the interface 212 to form a conductive link 219 between the first 210 and second 220 electrodes. The conductive link 219 supplants a portion of the interface 212 such that now, along the predetermined length 218, the first dielectric 221 and the second dielectric 222 are separated by the conductive link 219.

To program the anti-fuse structure 200, a programming voltage (V_prog) is applied to one of the electrodes at sufficient bias and for sufficient time, while ground is applied to the other electrode. The failure occurs (meaning the conductive link 219 forms) along the interface 212 because it is the weakest point between the adjacent electrodes 210, 220. For a given programming voltage (V_prog), the time necessary to form a conductive link 219 is dictated by the electric field (E_prog), which in turn is inversely proportional to the distance (i.e. predetermined length 218) between the electrodes 210, 220. For that reason, it is advantageous to have the predetermined length 218 as small as possible. For a given technology node, the minimum spacing between adjacent interconnects (i.e. which can be electrodes) is typically equal to the interconnect (i.e. electrode 210, 220, MX) width. For example, at the 22 nm node, interconnects may have a width of about 40 nm, therefore, the minimum spacing between the interconnects is also about 40 nm. Accordingly, in a level 215 having minimum dimensions in a 22 nm node device, the predetermined length 218 of adjacent electrodes 210, 220 would be about 40 nm. One skilled in the art will recognize that the predetermined length 218 will vary from level 215 to level of a device at a given node, and will scale from node to node as minimum dimensions scale from node to node.

As stated above, minimizing the predetermined length 218 is desirable in anti-fuse structures exploiting the TDDB mechanism. According, dual-level non-intrinsic anti-fuse structures are disclosed which further shrink the predetermined distance for a given node. Generically speaking, dual-level non-intrinsic anti-fuse embodiments of the current invention include a first electrode in one level while the second electrode is in another level. Preferably, the first electrode comprises a via and the second electrode is the metal line below the via (MX). In this specification, the term via generically refers to connections from the substrate to a metal level or connections from one metal level to another. The via can have a rectangular shape (as shown by the top-down view in FIG. 3A) where its width is at least about 1.5 times longer than its length, in which case the via is called a via bar (VXBAR). Alternatively, the via can have a square shape (as shown by the top-down view in FIG. 4A) where its width is roughly the same as its length, in which case the via is called VX. Those skilled in the art will recognize that the shapes may become rounded when actually formed. Several specific embodiments of the dual-level non-intrinsic anti-fuse structures are described in conjunction with FIGS. 3A-4C.

Figure 3A:
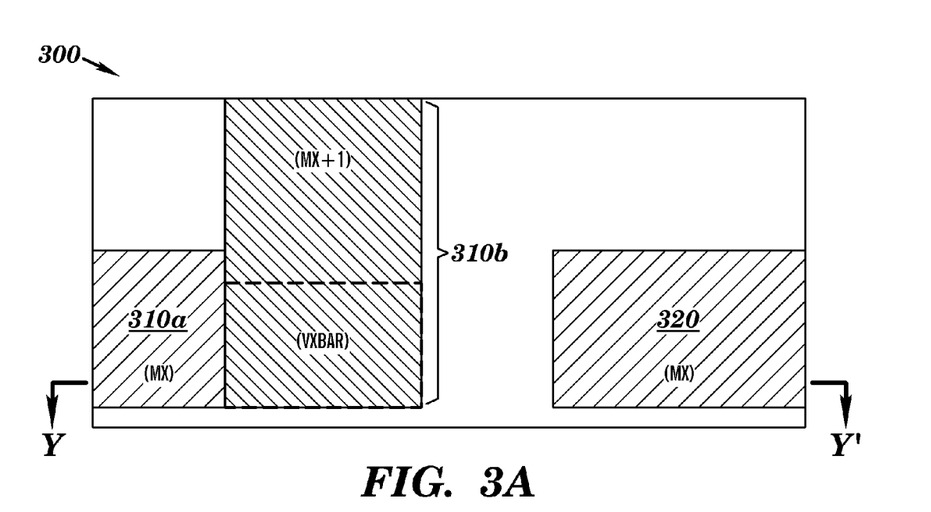
FIG. 3A illustrates a top-down view of a non-intrinsic, dual-level anti-fuse structure according to an embodiment of the present invention.
Figure 3B:
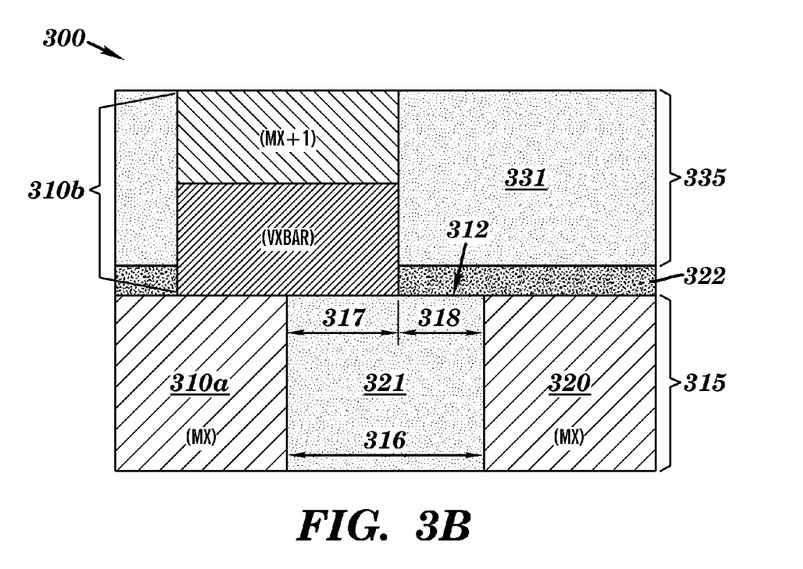
FIG. 3B illustrates a cross-section of the non-intrinsic, dual-level anti-fuse structure of FIG. 3A.
Figure 3C:
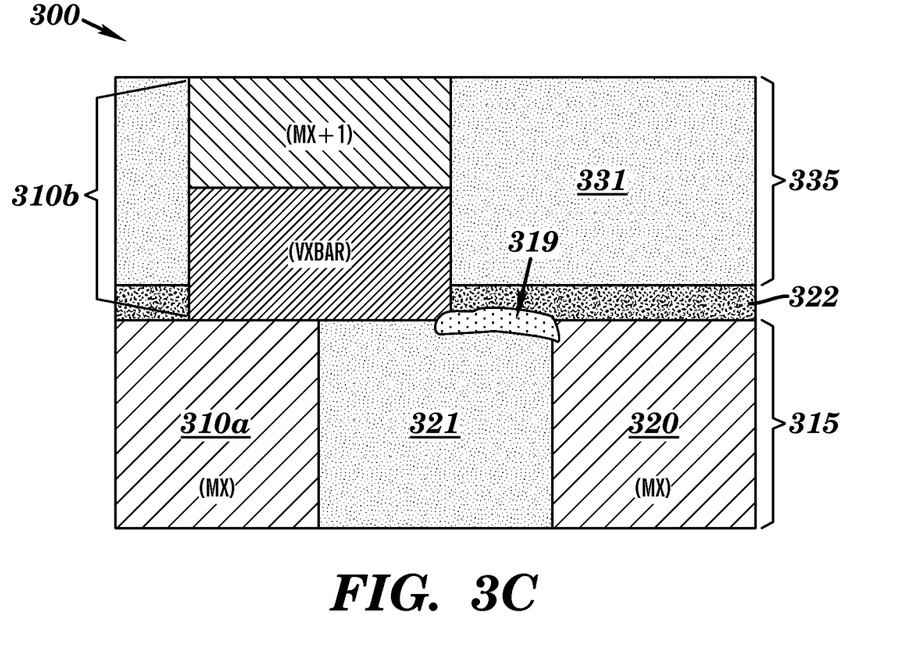
FIG. 3C illustrates a cross-section of the anti-fuse structure embodiment of FIG. 3B after programming.

Referring to FIG. 3A, a top-down view of a dual-level, non-intrinsic anti-fuse structure 300 is illustrated. A first electrode comprises a lower component 310a which is a metal line (MX) of a first level, and an upper component 310b which is a via and metal line (MX+1) of a second level. Preferably, as illustrated in FIG. 3A-C, the via is a via bar (VXBAR). Also in a preferred embodiment, upper component 310b is about two times wider than metal line (MX). A second electrode 320 is also a metal line (MX) of first level. In a preferred embodiment, the metal lines of different levels are orthogonal; thus, in the preferred embodiment, MX lines of the first level run in left to right manner relative to the page, whereas the MX+1 line of the second level runs in a top to bottom manner relative to the page. Note that in FIG. 3A all dielectric material has been removed for ease of viewing. Also note that the embodiment illustrated in FIG. 3A shows the via (here a via bar, VXBAR) fabricated preferably using "self-aligned via (SAV)" process, so that the right, left and bottom edges of the via are defined by the corresponding edges of the MX+1 metal line. Later, a self-aligned process is further discussed in conjunction with FIGS. 8A-G. A cross-section of anti-fuse structure 300 along Y-Y' is shown in FIG. 3B.

Referring to FIG. 3B anti-fuse structure 300 includes a first level 315 and a second level 335 separated by a second dielectric 322. The first level 315 includes a first dielectric 321 and first level 315 metal lines (MX). One of the metal lines (MX) comprises a lower portion 310a of a first electrode. The other metal line (MX) of the first level 315 is the second electrode 320 of the anti-fuse structure 300. The metal lines (MX) of the first level 315 are separated by a spacing 316. The second level 335 includes a third dielectric 331 and the upper portion 310b of the first electrode. The upper portion 310b of the first electrode includes a metal line (MX+1) of the second level 335 and a via. Preferably, the via is a via bar (VXBAR). Preferably, the metal line (MX+1) is about two times wider than the metal line MX in the lower level. In a preferred embodiment the viabar (VXBAR) is partially landed on the metal line (MX) below; the metal line (MX) below upon which the via bar (VXBAR) is partially landed is the lower portion 310a of the first electrode. Therefore, the upper 310b and lower 310a portions of the first electrode are in electrical contact with each other.

Still referring to FIG. 3B, a second dielectric 322 is above the first level 315. The first 321 and second 322 dielectrics meet to form an interface 312. Because the via bar (VXBAR) is partially landed, the interface 312 couples the first electrode at the upper portion 310b and the second electrode 320. The distance along the interface 312 which couples the adjacent first electrode portion and second 320 electrode is the predetermined length 318. By partially landing the via bar (VXBAR) so that it is offset toward the second electrode 320, the predetermined length 318 is shortened and can be less than spacing 316. When spacing 316 is a minimum spacing, then the predetermined length is less than the minimum spacing. Having a predetermined length 318 less than minimum spacing eases programming. Returning to the 22 nm node example, a typical minimum spacing between metal lines of the same level (MX to MX in the first level 315 of FIG. 3B) would be 40 nm. However, due to the offset 317 caused by partially landing the via bar (VXBAR) of the upper portion 310a of the first electrode, the predetermined width 318 is less than 40 nm (the spacing 316). Thus, by using a dual-level anti-fuse structure of the current invention, the predetermined length 318 can be less than the spacing (minimum or otherwise) between adjacent metal lines on the same level. In a preferred embodiment, the offset 317 can be from about 0 percent to about 50 percent of the spacing between metal lines of the same level, and ranges there between. Or stated another way, using 22 nm node with a minimum spacing of 40 nm as an example, the offset 317 can be from about 0 nm to about 20 nm and ranges there between. In an embodiment of a non-intrinsic, dual-level anti-fuse structure 300, the predetermined length 318 can be from about 100 percent to about 50 percent of spacing between metal lines of the same level, and ranges there between. Or stated another way, using 22 nm node with a minimum spacing of 40 nm as an example, the predetermined length 318 can be from about 40 nm to about 20 nm and ranges there between.

Continuing with FIG. 3B, a preferred embodiment of a dual-level anti-fuse structure is illustrated. In this preferred embodiment, the via bar portion VXBAR is made by a self-aligned process as defined by a wide metal line (MX+1) at the second level 335. The combination of a wide metal line (MX+1) at the second level 335 and the self-aligned via bar (VXBAR) easily creates a via bar (VXBAR) which is partially landed thereby extending closer to the second electrode 320. As explained above, the advantage of using a self-aligned process is better control of the predetermined length 318 and the ability to create a predetermined length 318 which is less than the spacing 316 between metal lines (MX) on the first level 315.

The materials for dielectric and electrodes are the same as in FIGS. 2A and 2B and will not be repeated here. In addition, third dielectric 331 of FIG. 3B may be selected from the same materials as described for the first dielectric 221.

Referring to FIG. 3C a programmed dual-level anti-fuse structure of FIG. 3A is illustrated. The programming method is the same as described in conjunction with FIG. 2B. Similarly, the failure occurs (meaning the conductive link 319 forms) along the interface 312 because it is the weakest point between the adjacent electrodes 310 (specifically 310b) and 320.

Figure 4A:
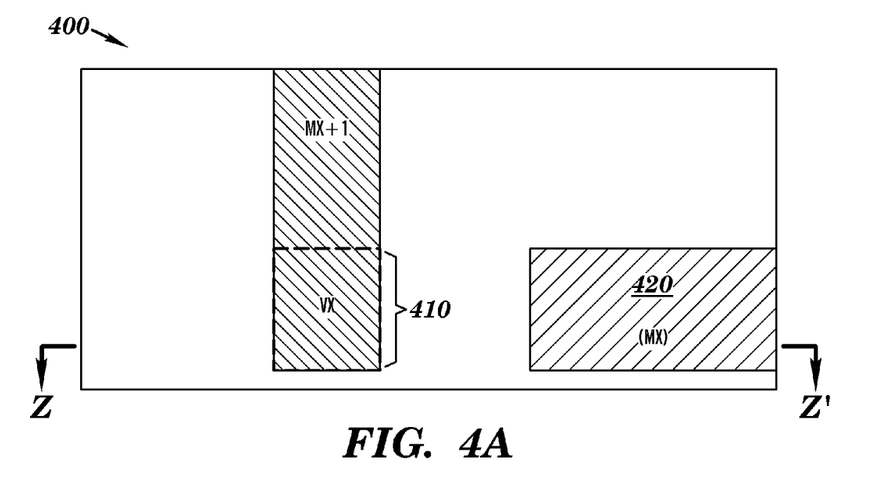
FIG. 4A is a top-down view of a non-intrinsic, dual-level anti-fuse structure according to an embodiment of the present invention.

Referring to FIG. 4A, a top-down view of an alternate dual-level anti-fuse structure 400 embodiment is shown. The anti-fuse structure 400 has a first electrode 410 which includes a via of a second level. Another terminal is a second electrode 420 which is a metal line (MX) of a first level. Note that in FIG. 4A all dielectric material has been removed for ease of viewing. Also, note that in a preferred embodiment shown in FIG. 4A, the via is VX, rather than a via bar, fabricated preferably using "self-aligned via (SAV)" process, so that the right, left and bottom edges of the via are defined by the corresponding edges of the MX+1 metal line. Later, a self-aligned process is further discussed in conjunction with FIGS. 8A-G. A cross-section of anti-fuse structure 400 along Z-Z' is shown in FIG. 4B.

Figure 4B:
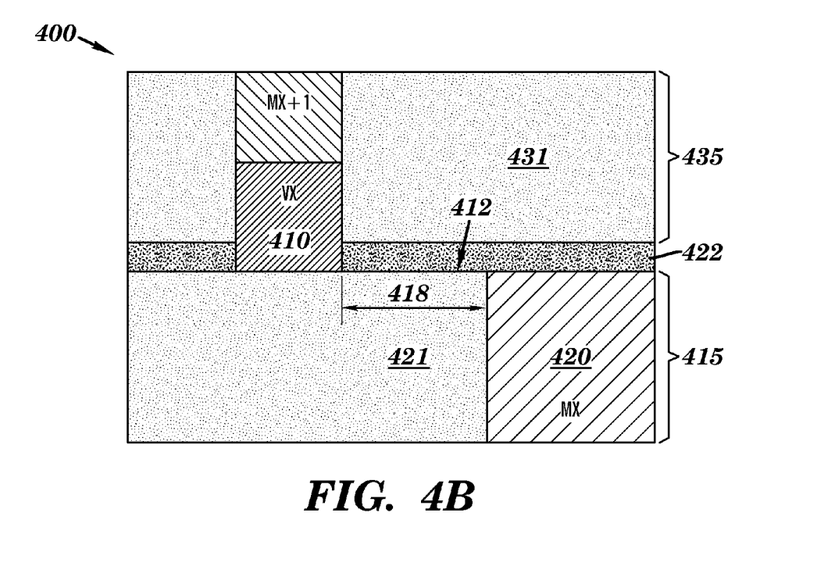
FIG. 4B illustrates a cross-section of the non-intrinsic, dual-level anti-fuse structure of FIG. 4A.

Referring to FIG. 4B anti-fuse structure 400 includes a first level 415 and a second level 435 separated by a second dielectric 422. The first level 415 includes a first dielectric 421 and first level 415 metal line (MX). The metal line (MX) of the first level 415 is the second electrode 420 of the anti-fuse structure 400. The second level 435 includes a third dielectric 431 and the first electrode 410. The first electrode 410 includes the via (VX) of the second level 435. Above the via (VX) is a metal line (MX+1) of the second level 435 which can be about the same width as the metal line MX in the lower level. A second dielectric 422 is above the first level 415. The first 421 and second 422 dielectrics meet to form an interface 412. The interface 412 couples the first electrode 410 and the second electrode 420. The distance along the interface 412 which couples the corners of adjacent first electrode 410 and second electrode 420 is the predetermined length 418.

The dual-level-structure of FIG. 4B differs from that in FIG. 3B in that the via (VX) is unlanded in FIG. 4B. Thus, in a non-programmed state, the via (VX) is not in contact with any underlying metal of the first level 415. The dual-level-structure of FIG. 4B differs from the anti-fuse structure in FIG. 2B in that the first electrode 410 (via (VX) of the second level 435) is on a different level than the second electrode (420).

In a preferred embodiment of the non-intrinsic, dual-level anti-fuse structure 400, via (VX) is self-aligned as defined by the MX+1 above. Preferably, the MX+1 line is minimum width, consequently via (VX) of the first electrode 410 is of minimum width thereby increasing the aspect ratio of the via (VX)/metal line (MX+1) structure. A high aspect ratio via under a narrow line has the effect of degrading the liner quality at the bottom of the via (VX). Consequently, it will be easier to program the anti-fuse. High aspect ratios include aspect ratios greater than about 2:1. Here, the height of the aspect ratio is the combined height of the via (VX) and metal line (MX+1). The width of the aspect ratio is the width where via (VX) and metal line (MX+1) meet.

Figure 5A:
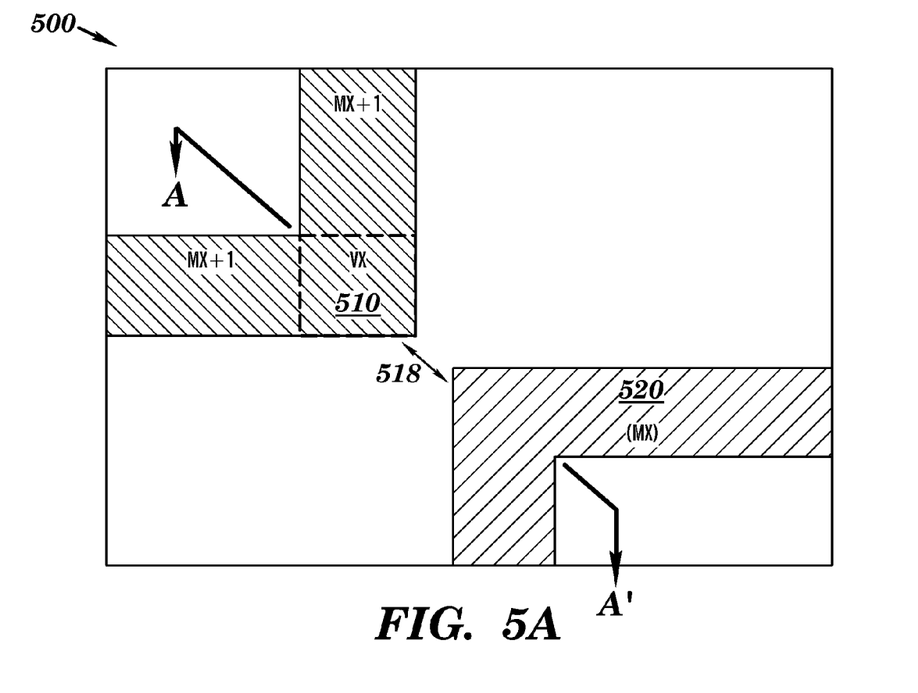
FIG. 5A is a top-down view of a non-intrinsic anti-fuse structure according to an embodiment of the present invention.

Referring to FIG. 5A, a top-down view of another anti-fuse structure 500 embodiment is shown. Here, the first 510 and second 520 electrodes are oriented so that the predetermined length 518 couples the corners of the two electrodes. Corners concentrate the electric field; therefore, programmability will be enhanced by an anti-fuse structure of FIG. 5A. Note that in FIG. 5A all dielectric material has been removed for ease of viewing. A cross-section of anti-fuse structure 500 along A-A' is shown in FIG. 5B.

Figure 5B:
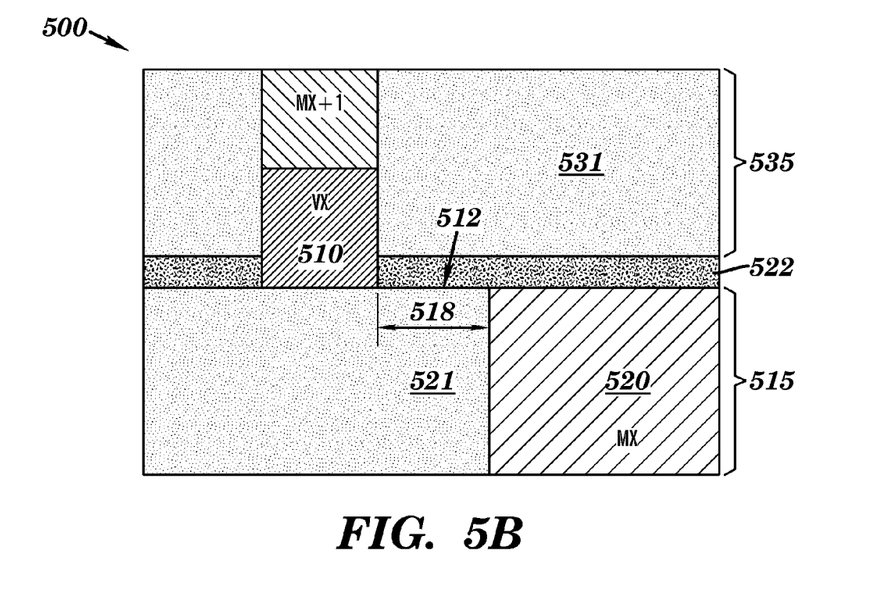
FIG. 5B illustrates a cross-section of the non-intrinsic anti-fuse structure of FIG. 5A.

Referring to FIG. 5B anti-fuse structure 500 includes a first level 515 and a second level 535 separated by a second dielectric 522. The first level 515 includes a first dielectric 521 and at least one first level 515 metal line (MX). In FIG. 5B, a metal line (MX) of the first level 515 is the second electrode 520 of the anti-fuse structure 500. The second level 535 includes a third dielectric 531 and the first electrode 510. The first electrode 510 includes a metal line (MX+1) of the second level 535 and a via (VX). In the embodiment shown in FIG. 5B the via (VX) is unlanded (similar to the structure in FIG. 4B). Still referring to FIG. 5B, a second dielectric 522 is above the first level 515. The first 521 and second 522 dielectrics meet to form an interface 512. The interface 512 couples the first electrode 510 and the second electrode 520. The distance along the interface 512 which couples the corners of adjacent first electrode 510 and second electrode 520 is the predetermined length 518.

While FIG. 5B discloses an unlanded dual-level structure (similar to FIG. 4B), those skilled in the art will recognize that a partially landed structure (similar to FIG. 3B) can also be used. In addition, the via could be a via bar. Furthermore, a single-level structure taking advantage of the corner field concentration can also be used. In the single-level embodiment, the first electrode 510 is in the first level 515.

Those skilled in the art will also recognize that while corners having 90 degrees were used to enhanced field concentration, other shapes may also be used which also enhanced field concentration. By way of example, and not limitation, other shapes which can enhance filed concentration and hence programmability are corners other than 90 degrees (preferable less than 90 degrees), and curves having a small radius of curvature.

To summarize the non-intrinsic anti-fuse structures of the present invention, all embodiments feature a structure which is programmed by a breakdown of a dielectric to dielectric interface rather than a breakdown through a thickness of a dielectric layer. As a result the programmed anti-fuse structures of the present invention have a conductive link which couples adjacent electrodes by following the dielectric to dielectric interface rather than a conductive link that couples adjacent electrodes by going through the thickness of an anti-fuse dielectric layer.

In further summary, the non-intrinsic anti-fuse structures can be single-level or dual-level structures. In single-level structures the first and second electrodes are in the same level. In single-level structures, the predetermined length is equal to the spacing of between the adjacent electrodes, preferable the spacing is minimum spacing (i.e. equal to the line width of a minimally dimension line). Single-level non-intrinsic anti-fuse devices preferable have two terminals. In dual-level structures, at least a portion of the first electrode is in a second level and the second electrode is in the first level. The first electrode can be partially landed or unlanded. In either case, the predetermined length can be reduced to something less than the minimum spacing of the first level interconnects. Preferably dual-level non-intrinsic anti-fuse structures are made by a self aligned via method. In one preferred embodiment the via can be self-aligned through a large second level metal line and is partially landed on underlying interconnect. In another preferred embodiment the via is self-aligned through a narrow second level metal line and is unlanded.

In both single-level and dual-level non-intrinsic anti-fuse structures of the present invention, the predetermined length may extend from "pointy" portion of a first electrode (a corner, for example) to a "pointy" portion of a second electrode to enhance field concentration and thus enhance programmability.

An advantage of the non-intrinsic anti-fuse structures of the present invention are that programming is through a dielectric to dielectric interface rather than the dielectric thickness, therefore, lower voltages are required. Another advantage of the dual-level structures is that predetermined lengths less than the minimum line spacing at a level can be achieved. A shorter length to program is easier to program. By using a dual-level structure, the predetermined length can be reduced to something less than minimum line spacing (at the first level) without fear of shorting. A further advantage of the non-intrinsic anti-fuse structures of the present invention is that no extra lithography or processing steps are needed to create the structures. Thus, the structures can be seamlessly integrated into existing processing schemes. The next section describes in more detail a method to make non-intrinsic anti-fuse device of the present invention.

Figure 6:
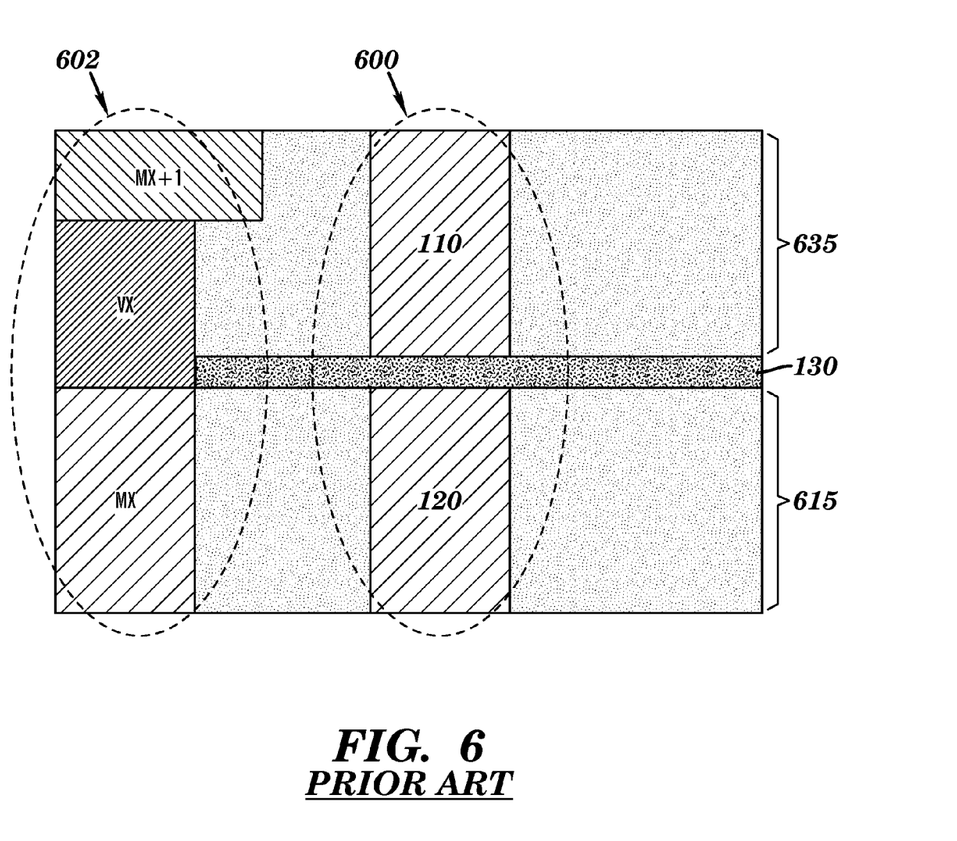
FIG. 6 illustrates an active structure and a conventional intrinsic anti-fuse structure.

Referring to FIG. 6, a prior art structure including an intrinsic dual-level anti-fuse structure 600 and an active structure 602 is illustrated. The first electrode 110 is in a 635 second level while a second electrode 120 of the anti-fuse structure is in a first level 615. The first 110 and second 120 electrodes of the anti-fuse structure 600 are separated by an anti-fuse layer 130. The anti-fuse layer is a dielectric whose thickness must be breached to program the anti-fuse. The active structure 602 is a second level line MX+1, and via VX in contact with a first level line MX. There is no anti-fuse layer in the active structure 602. It is obvious from viewing FIG. 6, that at least a separate masking step or filling step is needed in order to make active 602 and anti-fuse 600 structures which have different material stacks from each other.

Figure 7:
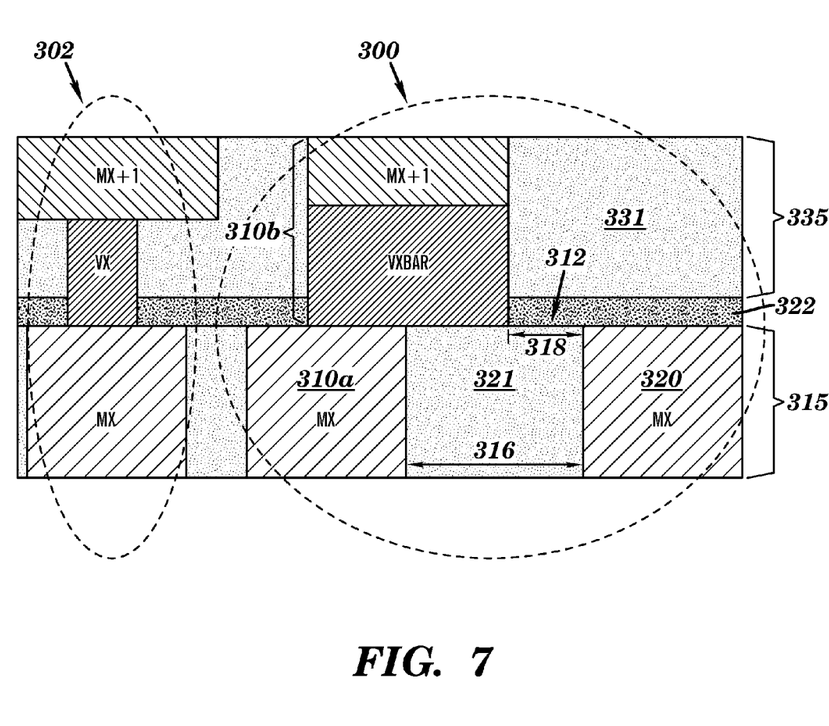
FIG. 7 illustrates an active structure and a non-intrinsic anti-fuse structure according to an embodiment of the present invention.

In contrast, referring to FIG. 7, the non-intrinsic anti-fuse structures of the present invention have the same material stack as an active structure. FIG. 7 illustrates an embodiment having a dual damascene active structure 302 and a dual-level non-intrinsic anti-fuse structure 300 that was previously described in conjunction with FIG. 3B. In viewing FIG. 7, it is clear that the active structure 302 and the anti-fuse structure 300 have the same material stack, therefore they can be formed at the same time without an extra masking or filling steps.

Figure 8A:
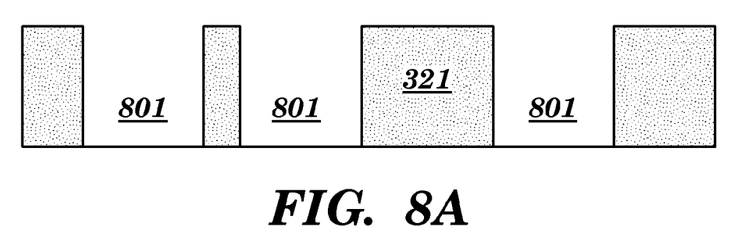
FIGS. 8A-8G illustrate steps of making a non-intrinsic anti-fuse structure according to an embodiment of the present invention.
Figure 8B:
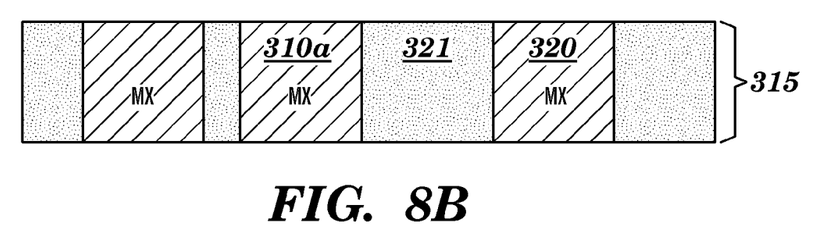
Figure 8C:
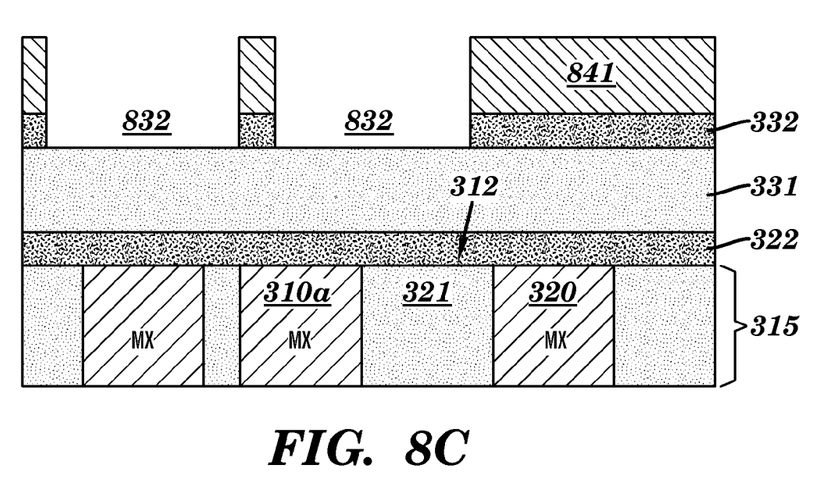

Referring to FIG. 8A, to make the structures illustrated in FIG. 7, a first dielectric 321 is formed and first openings 801 made in the first dielectric 321. The first openings 801 in the first dielectric 321 are filled with a conductive material. Referring to FIG. 8B, typically, the conductive material and is polished to be co-planar with the first dielectric 321 and form the first level 315 of the structures. After planarization, the conductive material forms the first level metal lines MX, two of which are electrodes (310a and 320) of the anti-fuse structure 300. Next, referring to FIG. 8C, the second dielectric 322 is formed over the first level 315. There is an interface 312 between the first 321 and second 322 dielectrics. A third dielectric 331 is formed above the second dielectric 322. An optional hardmask 332 is formed above the third dielectric 331. Using a first photoresist 841 and a metal level mask (here, MX+1), hardmask openings 832 are made in hardmask 332.

Figure 8D:
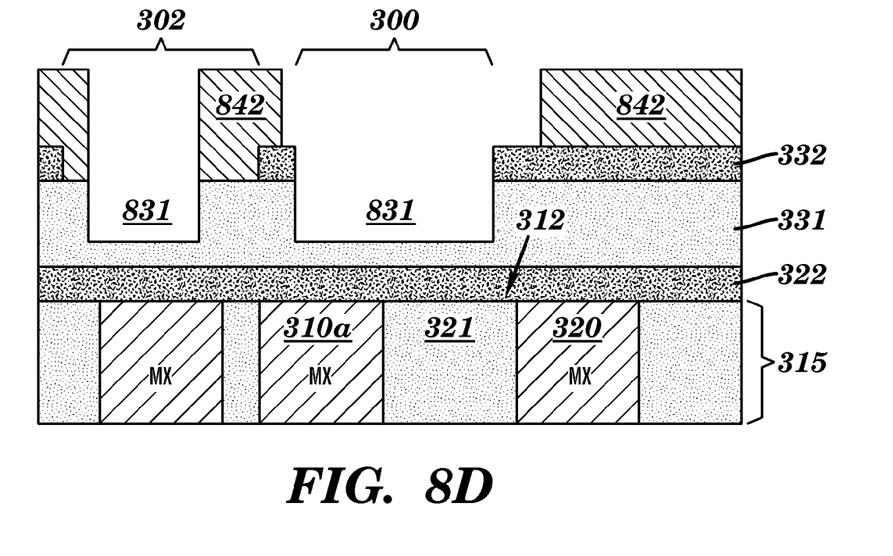

Referring to FIG. 8D, a second photoresist 842 and a via level mask are used to etch the via opening 831 in the third dielectric 331. In the embodiment illustrated in FIG. 8D, the via opening 831 in the future active area 302 is defined by the second photoresist 842. The via opening 831 in the future anti-fuse area 302 is defined by the hardmask 332, thus forming a self-aligned via. Here, self-aligned refers to the fact that by using the hardmask pattern with the MX+1 opening, the via is aligned with respect to the metal line (MX+1). While FIG. 8D shows the via opening 831 of the anti-fuse area 300 self-aligned and the via opening 831 of the active area 302 not self-aligned, both via openings could be self-aligned or neither opening could be self-aligned.

Figure 8E:
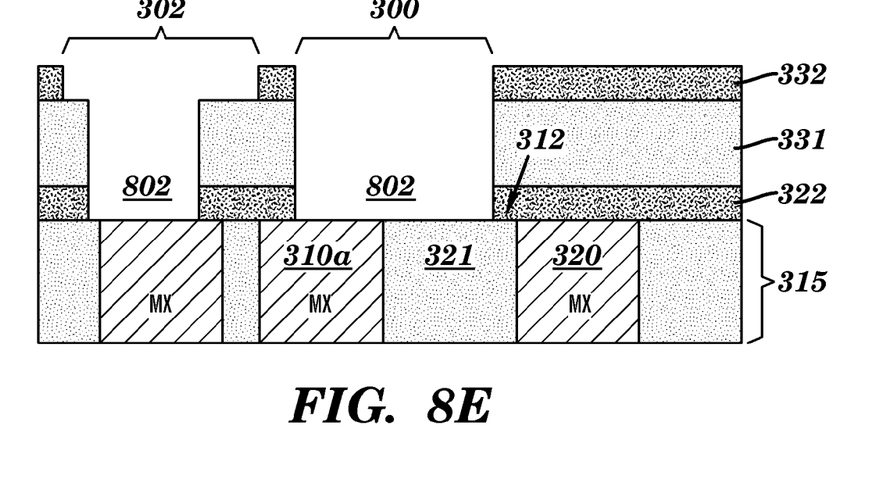

Referring to FIG. 8E, the second photoresist 842 has been removed and the structure is etched through hardmask 332 to from second openings 802 in the second and third dielectrics. The second openings for the active 302 and anti-fuse 300 structures are made using the same mask set, there is no additional lithography step of mask needed to form the active 302 and anti-fuse 300 structures. The second openings 802 for the anti-fuse 300 and active 302 structures are made simultaneously.

Figure 8F:
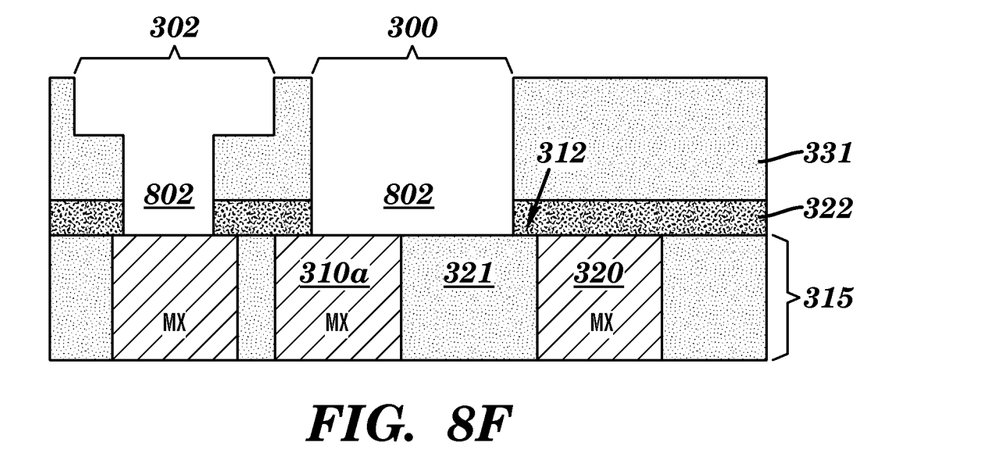
Figure 8G:
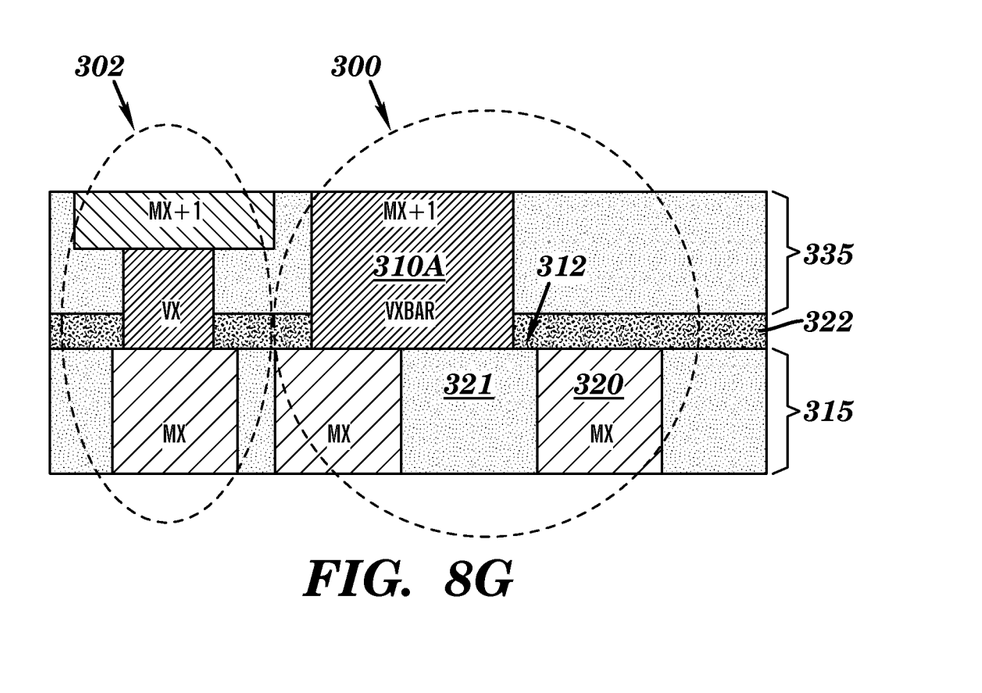

Referring to FIG. 8F, the hardmask 332 has optionally been removed and the second openings 802 for the anti-fuse 300 and active 302 structures are then filled simultaneously with a conductive material and planarized to form the second level 335 having a lines (MX+1) and vias (VX and VXBAR) to result in FIG. 8G. The left side of FIG. 8G illustrates an active structure and the right side the anti-fuse structure 300 which were made simultaneously.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. An anti-fuse structure comprising:
   a first interconnect level comprising a first electrode embedded in a first dielectric layer, a top surface of the first electrode is substantially flush with a top surface of the first dielectric layer;
   a second interconnect level comprising a via embedded in a second dielectric layer above the first dielectric layer;
   a third dielectric layer in direct contact with and separating the first dielectric layer and the second dielectric layer, an entire top surface of the first electrode is in direct physical contact with a bottom surface of the third dielectric layer; and
   an interface between the first dielectric layer and the third dielectric layer extending from the top surface of the first electrode to the via, the interface comprising a length less than a minimum width of the via,
   wherein a bottom surface of the via is in direct physical contact with the first dielectric layer.

2. The structure of claim 1, further comprising:
   a narrow metal line above and in direct contact with the via, both the narrow metal line and the via have the same width.

3. The structure of claim 1, wherein a distance between the first electrode and the via, measured along the interface, is less than a spacing between the first electrode and an adjacent interconnect in the first dielectric layer.

4. The structure of claim 1, wherein a distance between the first electrode and the via, measured along the interface, is less than a width of the via.

5. The structure of claim 1, wherein the first electrode and the via are arranged so that the interface extends from a corner of the first electrode to a corner of the via.

6. The structure of claim 1, further comprising:
   a narrow metal line above and in direct contact with the via, both the narrow metal line and the via have the same width, and the via is self-aligned to the narrow metal line.

7. The structure of claim 1, further comprising:
   a second electrode embedded in the first dielectric layer and in direct contact with the via.

8. The structure of claim 1, further comprising:
   a second electrode embedded in the first dielectric layer and in direct contact with the via, the via is offset toward the first electrode such that the length of the interface is less than a distance between the first electrode and the second electrode.

9. The structure of claim 1, wherein the via is a via bar comprising a width at least 1.5 times larger than its length.

10. The structure of claim 1, wherein the via is unlanded.

* * * * *